(12) United States Patent
Loewen et al.

(10) Patent No.: US 10,340,048 B2
(45) Date of Patent: Jul. 2, 2019

(54) PASSIVE SAFETY SYSTEM FOR REMOVING DECAY HEAT AND METHOD OF PASSIVELY INCREASING A COOLANT FLOW USING THE SAME

(71) Applicants: Eric Paul Loewen, Wilmington, NC (US); Seth Ryan Paul Strege, Wilmington, NC (US); Nicholas Francis O'Neill, Wilmington, NC (US); Levon Pierre Keusseyan, Wilmington, NC (US)

(72) Inventors: Eric Paul Loewen, Wilmington, NC (US); Seth Ryan Paul Strege, Wilmington, NC (US); Nicholas Francis O'Neill, Wilmington, NC (US); Levon Pierre Keusseyan, Wilmington, NC (US)

(73) Assignee: GE-Hitachi Nuclear Energy Americas LLC, Wilmington, NC (US)

( * ) Notice: Subject to any disclaimer, the term of this patent is extended or adjusted under 35 U.S.C. 154(b) by 708 days.

(21) Appl. No.: 14/804,488

(22) Filed: Jul. 21, 2015

(65) Prior Publication Data

US 2017/0025194 A1    Jan. 26, 2017

(51) Int. Cl.
*G21C 15/18* (2006.01)
*G21C 15/24* (2006.01)
*H01L 35/30* (2006.01)

(52) U.S. Cl.
CPC .......... *G21C 15/18* (2013.01); *G21C 15/182* (2013.01); *G21C 15/24* (2013.01); *H01L 35/30* (2013.01)

(58) Field of Classification Search
CPC ...... G21C 15/18; G21C 15/182; G21C 15/24; H01L 35/30

(Continued)

(56) References Cited

U.S. PATENT DOCUMENTS 3,615,869 A * 10/1971 Barker .................. G21H 1/103
                                                      136/202
3,923,007 A    12/1975 Schroder
(Continued)

FOREIGN PATENT DOCUMENTS

EP          2151829 A1    2/2010
WO    WO-2011043513 A1    4/2011

OTHER PUBLICATIONS

Triplett, "PRISM: A Competitive Small Modular Sodium-Cooled Reactor", Nuclear Technology, vol. 178, May 2012, pp. 186-200. (Year: 2012).*

(Continued)

*Primary Examiner* — Jack W Keith
*Assistant Examiner* — Daniel Wasil
(74) *Attorney, Agent, or Firm* — Harness, Dickey & Pierce, P.L.C.

(57) ABSTRACT

A passive safety system for removing decay heat from a nuclear power system may comprise a shroud structure and a heat generator that is within the shroud structure. A thermoelectric device may be disposed in thermal contact with the heat generator. The thermoelectric device is configured to generate a voltage based on a temperature difference between opposite parts of the thermoelectric device. A fan arrangement is disposed above the heat generator and in electrical connection with the thermoelectric device. The fan arrangement is configured to increase a coolant flow through the coolant passage to the outlet opening based on the voltage from the thermoelectric device.

20 Claims, 5 Drawing Sheets

(58) Field of Classification Search
USPC .................................................. 376/299, 321
See application file for complete search history.

(56) References Cited

U.S. PATENT DOCUMENTS

| | | | |
|---|---|---|---|
| 4,304,198 A | 12/1981 | Stiefel | |
| 5,774,517 A | 6/1998 | Palavecino et al. | |
| 6,053,163 A | 4/2000 | Bass | |
| 7,949,084 B2 | 5/2011 | Song et al. | |
| 2006/0174634 A1 | 8/2006 | Hsu | |
| 2007/0076835 A1 | 4/2007 | Tobimatsu et al. | |
| 2008/0087315 A1 | 4/2008 | Deming et al. | |
| 2011/0029152 A1 | 2/2011 | Patel et al. | |
| 2011/0110484 A1 | 5/2011 | Ahlfeld et al. | |
| 2012/0294737 A1* | 11/2012 | Singh | G21C 15/243 417/410.1 |
| 2013/0028365 A1* | 1/2013 | Tatli | G21C 19/08 376/272 |
| 2014/0150994 A1* | 6/2014 | Singh | G21C 15/18 165/104.13 |
| 2014/0177775 A1* | 6/2014 | Loewen | G21F 5/008 376/272 |
| 2014/0270042 A1 | 9/2014 | Dederer | |
| 2016/0019991 A1* | 1/2016 | Dederer | G21F 5/008 376/272 |
| 2017/0222114 A1* | 8/2017 | Timm | H01L 25/0753 |
| 2017/0263340 A1* | 9/2017 | Kim | G21C 15/182 |
| 2018/0233240 A1* | 8/2018 | Kim | G21C 15/182 |

OTHER PUBLICATIONS

Korea priority application 10-2014-0107928, filed Aug. 19, 2014. (Year: 2014).*
PCT Search Report issued in connection with corresponding WO Patent Application No. US2016/038318 dated Sep. 6, 2016.
Office Action for Canadian Application No. 2,992,976 dated Nov. 26, 2018.
Search Report for corresponding European Application No. 16 739 291.9 dated Mar. 13, 2019.
International Preliminary Report on Patentability for Application No. PCT/US2016/038318 dated Jan. 23, 2018.

* cited by examiner

PASSIVE SAFETY SYSTEM FOR REMOVING DECAY HEAT AND METHOD OF PASSIVELY INCREASING A COOLANT FLOW USING THE SAME

BACKGROUND

Field

The present disclosure relates to systems and methods for cooling a nuclear reactor.

Description of Related Art

Conventional nuclear power systems may remove decay heat using natural circulation. However, there may be a problem with the time and effectiveness of reactor shutdown in normal and emergency situations when heat cannot be rejected to the condenser. The Fukushima incident highlights the dangers of not having a backup to a safety grade decay heat removal system during station black out (SBO) or external hazards beyond design basis.

SUMMARY

A passive safety system for removing decay heat from a nuclear power system may comprise a shroud structure including a body portion and an upper portion. The upper portion includes an outlet opening. A heat generator is within the body portion of the shroud structure. An inner surface of the body portion of the shroud structure and an outer surface of the heat generator define a coolant passage therebetween. The coolant passage is in fluidic communication with the outlet opening. A thermoelectric device may be disposed in the coolant passage and in thermal contact with the heat generator. The thermoelectric device is configured to generate a voltage based on a temperature difference between opposite parts of the thermoelectric device. A fan arrangement is disposed above the heat generator and in electrical connection with the thermoelectric device. The fan arrangement is configured to increase a coolant flow through the coolant passage to the outlet opening based on the voltage from the thermoelectric device.

The heat generator may be a steam generator of a liquid metal cooled reactor. The thermoelectric device may be closer to the heat generator than the shroud structure. The thermoelectric device may be at a distance of about 3 inches or less from the heat generator. The thermoelectric device may have a thickness that is less than half of a spacing distance between the heat generator and the shroud structure. The thermoelectric device may be a sheet-like article that is conformally-shaped to follow contours of the heat generator. The thermoelectric device may be arranged so as to be closer to a top of the heat generator than a bottom of the heat generator. The thermoelectric device may surround at least 25% of a side surface of the heat generator.

With regard to the temperature difference, the opposite parts of the thermoelectric device may include an inner surface and an opposing outer surface, the inner surface being closer to the heat generator, the outer surface being closer to the shroud structure. Alternatively, the opposite parts of the thermoelectric device include an upper end and an opposing lower end, the upper end being closer to a top of the heat generator, the lower end being closer to a bottom of the heat generator.

The thermoelectric device may be in a form of a plurality of thermoelectric generators surrounding the heat generator. Each of the plurality of thermoelectric generators may be electrically connected to jointly power the fan arrangement with the voltage. Alternatively, one of the plurality of thermoelectric generators may be a primary source of the voltage, while another of the plurality of thermoelectric generators is a backup source of the voltage. In another instance, the fan arrangement may be in a form of a plurality of fans, and each of the plurality of thermoelectric generators is electrically connected to one of the plurality of fans. The fan arrangement may be disposed in the upper portion of the shroud structure below the outlet opening.

A method of passively increasing a coolant flow in a natural circulation decay heat removal system may comprise arranging a thermoelectric device so as to be in electrical connection with a fan structure and so as to be within a coolant passage for the coolant flow. The coolant passage may be defined by an inner surface of a shroud structure and an outer surface of a heat generator. The method may additionally include supplying a voltage to the fan arrangement from the thermoelectric device based on a temperature difference caused by the heat generator in order to increase the coolant flow.

The supplying may be based on the temperature difference between opposite parts of the thermoelectric device being at least 30 degrees Celsius. Additionally, the supplying may be such that the voltage is at least 12 volts. The supplying may also be such that a discharge velocity of the coolant flow is increased to at least 80 feet/second. Furthermore, the supplying may occur during a scheduled or emergency shutdown of a nuclear power system.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION

Figure 1:
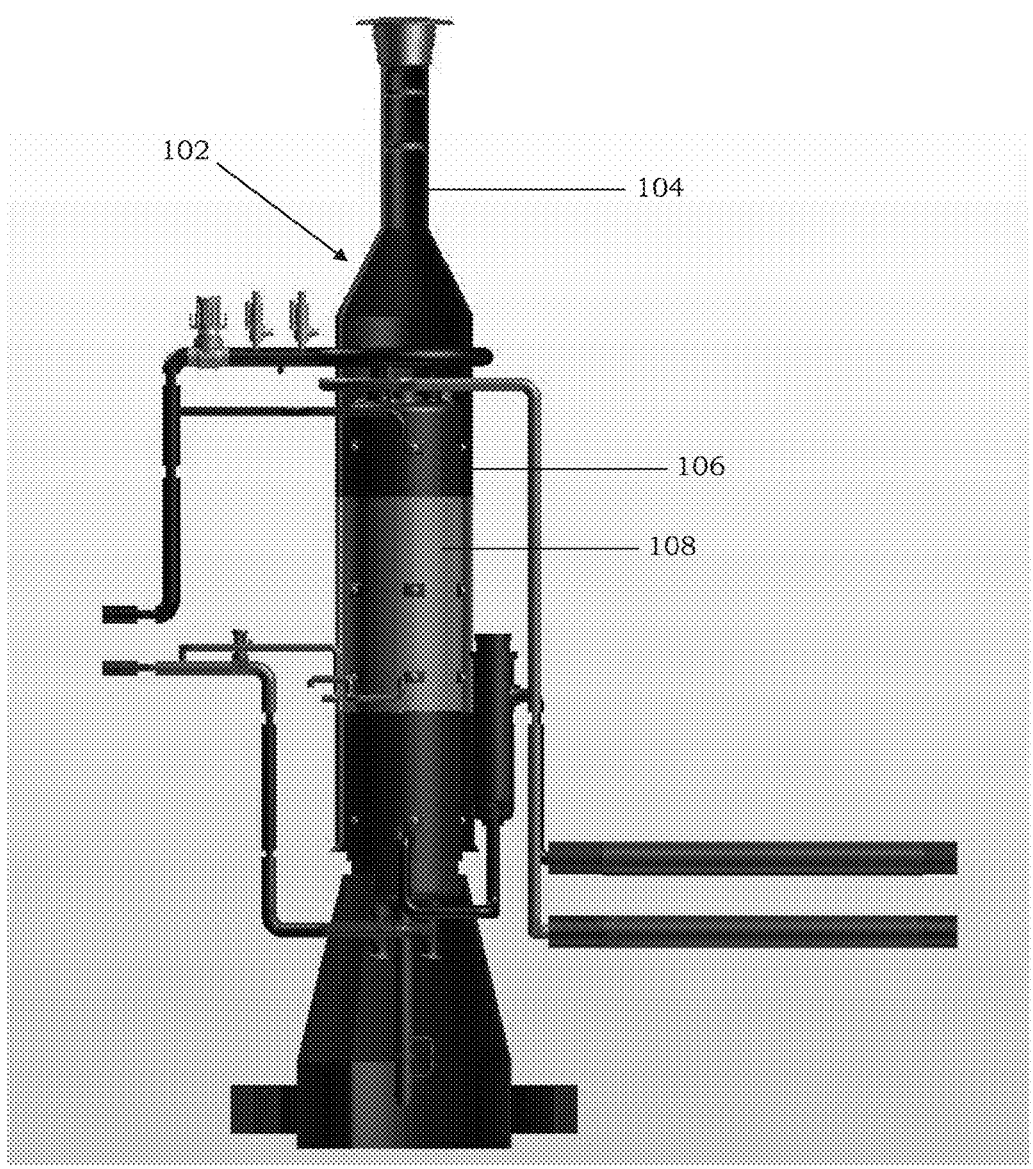
FIG. 1 is a partial, cross-sectional view of a passive safety system for removing decay heat from a nuclear power system according to an example embodiment.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

A thermoelectric device is a solid-state article that is configured to convert heat into electricity. Such an article has no moving parts and produces electrical power from the flow of heat across a temperature gradient. Notably, as the heat flows from a hot end to a cold end, free charge carriers (electrons or holes) in the material may also be driven so as to diffuse to the cold end. In an example embodiment, a thermoelectric device may operate via a Seebeck effect. The resulting voltage, in such an instance, is proportional to the temperature difference via the Seebeck coefficient. By connecting an electron conducting (n-type) material and a hole conducting (p-type) material in series, a net voltage may be produced and driven through a load.

A safety system for a nuclear power system may be enhanced by using a thermoelectric device to increase coolant flow in response to increasing temperature conditions. In particular, a thermoelectric device may be used to create a passive safety system that improves decay heat removal in nuclear power systems using natural circulation. Decay heat removal from a nuclear power system during normal or emergency shutdown situations is key to safety (e.g., to prevent fuel damage and subsequent fission product release). In an example embodiment, the safety system increases the air flow rate as the temperature increases by using a thermoelectric motor to increase heat transfer (heat removal) during decay heat removal. Such a system may work as an enhancement to the natural circulation mechanism that drives the air flow during normal operation. Increasing decay heat removal has several benefits in normal and emergency shutdown situations. First, normal shutdown time is decreased, thereby allowing for more rapid refueling and service events. In addition, overall safety is improved due to the relatively efficient rejection of heat by the system, particularly in emergency situations without backup emergency power.

FIG. 1 is a partial, cross-sectional view of a passive safety system for removing decay heat from a nuclear power system according to an example embodiment. Referring to FIG. 1, the passive safety system for removing decay heat from a nuclear power system may include a shroud structure 102 including a body portion 106 and an upper portion 104. The upper portion 104 of the shroud structure 102 may be coaxial to the body portion 106. A thermoelectric device 108 may be disposed within the body portion 106 of the shroud structure 102, although example embodiments are not limited thereto. The body portion 106 of the shroud structure 102 may be cylindrical with a first diameter that tapers down to a smaller, second diameter of the upper portion 104 (which may also be cylindrical). The upper portion 104 of the shroud structure 102 includes an outlet opening (e.g., at the top end thereof).

Figure 2:
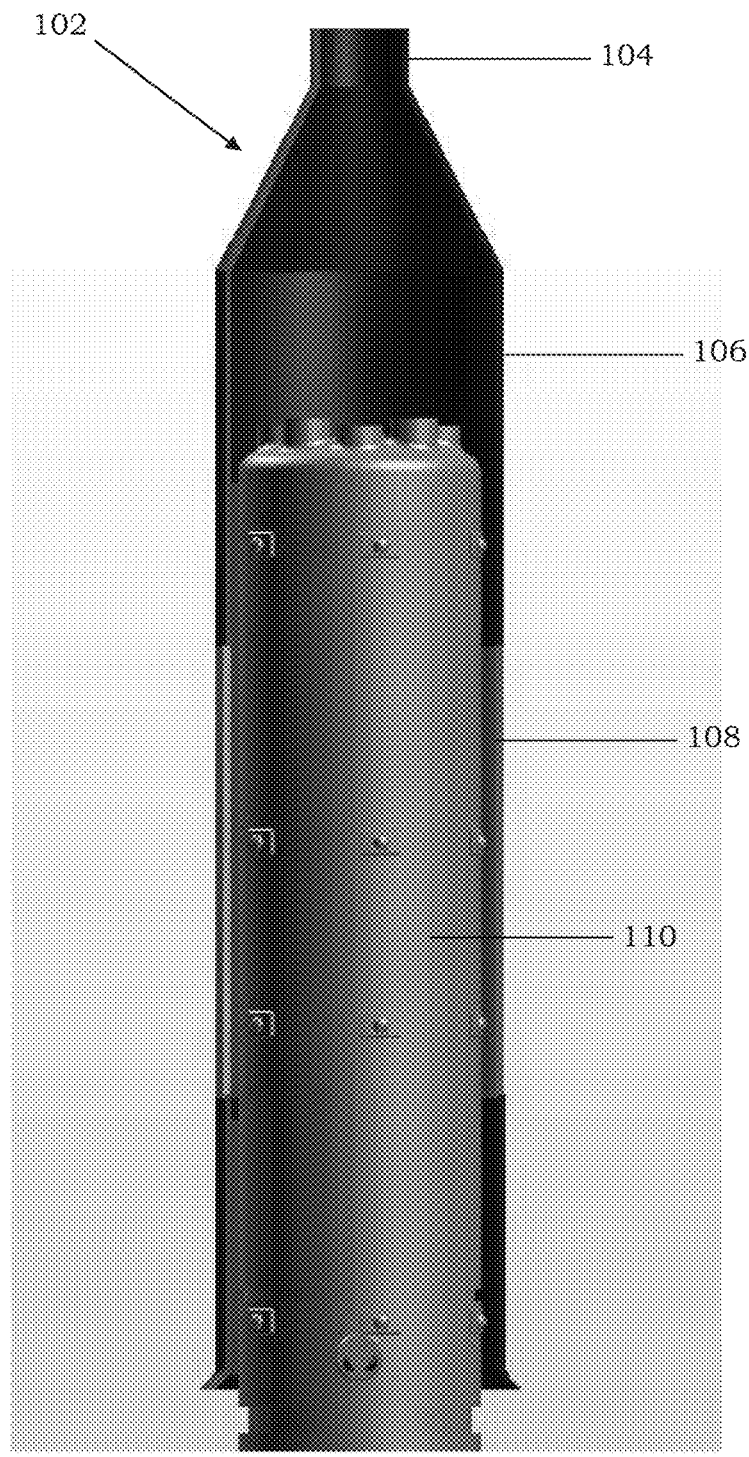
FIG. 2 is an enlarged view of the shroud structure in FIG. 1 with a heat generator arranged therein.

FIG. 2 is an enlarged view of the shroud structure in FIG. 1 with a heat generator arranged therein. Referring to FIG. 2, a heat generator 110 is arranged within the body portion 106 of the shroud structure 102. The heat generator 110 may be a steam generator of a liquid metal cooled reactor (e.g., sodium-cooled fast reactor), although example embodiments are not limited thereto. The heat generator 110 may be arranged concentrically within the body portion 106 of the shroud structure 102 so as to be evenly spaced from an inner surface of the body portion 106. The inner surface of the body portion 106 of the shroud structure 102 and an outer surface of the heat generator 110 define a coolant passage therebetween.

In an example embodiment, the spacing of an annular coolant passage (e.g., the orthogonal distance between the inner surface of the body portion 106 of the shroud structure 102 and the outer surface of the heat generator 110) may be a few inches. In such an instance, the thermoelectric device 108 may be positioned at a distance of about 3 inches or less from the heat generator 110. However, it should be understood that other suitable dimensions are possible for the coolant passage depending on the nuclear system. The coolant passage is in fluidic communication with the outlet opening in the upper portion 104 of the shroud structure 102. The coolant passage is configured to direct a flow of coolant (e.g., air) upward along the outer surface of the heat generator 110 in order to remove the heat therefrom.

The thermoelectric device 108 is arranged so as to be in thermal contact with the heat generator 110. It should be understood that "thermal contact" means that the arrangement of the thermoelectric device 108 relative to the heat generator 110 is such that the heat from the heat generator 110 will provide an adequate temperature gradient for the thermoelectric device 108 to convert the heat into electricity. For instance, the thermal contact may result in the temperature difference between the hot side (heat absorption side) and the opposing cold side (heat rejection side) of the thermoelectric device 108 being at least 30 degrees Celsius.

In an example embodiment, the thermoelectric device 108 may be disposed in the coolant passage (which is defined by the inner surface of the body portion 106 of the shroud structure 102 and the outer surface of the heat generator 110). In such an instance, the thermoelectric device 108 may be arranged directly on the heat generator 110, arranged directly on the inner surface of the body portion 106, or arranged so as to be spaced apart from both the heat generator 110 and the body portion 106. The thermoelectric device 108 may have a thickness that is less than half of a spacing distance between the heat generator 110 and the body portion 106 of the shroud structure 102, although it should be understood that other dimensions are also possible.

When arranged directly on the inner surface of the body portion 106, the shroud structure 102 may be configured such that the thermoelectric device 108 is seated partially (or completely so as to be flush with an adjacent surface) in a corresponding recess in the inner surface of the body portion 106. In another non-limiting embodiment, when in a spaced apart arrangement, the thermoelectric device 108 may be arranged so as to be closer to the heat generator 110 than the body portion 106 of the shroud structure 102.

Alternatively, it should be understood that the thermoelectric device 108 may be disposed outside of the coolant passage, provided that the thermoelectric device 108 is in thermal contact with the heat generator 110. For instance, the thermoelectric device 108 may be arranged directly on an outer surface of the body portion 106 of the shroud structure 102.

The thermoelectric device 108 is configured to generate a voltage based on a temperature difference between opposite parts of the thermoelectric device 108. The thermoelectric device 108 may be configured in a variety of ways to provide the requisite temperature gradient. In an example embodiment, the opposite parts of the thermoelectric device 108 may include an inner surface and an opposing outer surface, wherein the inner surface is closer to and faces the heat generator 110, while the opposing outer surface is closer to and faces the body portion 106 of the shroud structure 102. In such an instance, the inner surface of the thermoelectric device 108 will be the hot side (heat absorption side), while the opposing outer surface will be the cold side (heat rejection side).

The top of the heat generator 110 may be hotter than the bottom of the heat generator 110. As a result, to increase the temperature of the hot side (and, thus, the temperature gradient), the thermoelectric device 108 may be arranged closer to a top (e.g., upper sidewall) of the heat generator 110 than a bottom of the heat generator 110. In addition, in another example embodiment, the opposite parts of the thermoelectric device 108 may include an upper end and an opposing lower end, wherein the upper end is closer to a top of the heat generator 110, while the lower end is closer to a bottom of the heat generator 110. In such an instance, the upper end of the thermoelectric device 108 will be the hot side (heat absorption side), while the opposing lower end will be the cold side (heat rejection side).

A fan arrangement may be disposed above the heat generator 110 and in electrical connection with the thermoelectric device 108. For instance, the fan arrangement may be disposed in the upper portion 104 of the shroud structure 102 below the outlet opening. The fan arrangement may be configured to increase a coolant flow (e.g., air flow) through the coolant passage to the outlet opening in the upper portion 104 of the shroud structure 102 based on the voltage from the thermoelectric device 108. In an example embodiment, the thermoelectric device 108 may be used in connection with an auxiliary cooling system (ACS) of a nuclear reactor. The auxiliary cooling system (ACS) induces a natural circulation of air to flow past the shell side of the steam generator to remove heat when the heat cannot be rejected to the condenser. An auxiliary fan may be connected to the top of the exhaust stack, which may increase air flow when turned on during heat rejection. The auxiliary fan may be turned on by an operator or automatically powered by the thermoelectric device 108 in response to rising temperatures. The nominal discharge velocity of the exhaust air may be at least 80 feet/second (e.g., about 90-100 feet/second).

A PRISM reactor may use the above-mentioned auxiliary cooling system (ACS), which uses a natural circulation of air to remove heat from the steam generator and emits the air out of an exhaust stack. The present safety system and method enhances the heat removal and safety performance of a sodium-cooled fast reactor (SFR) system by using an additional device which works passively to generate current through a metal temperature differential which then drives a DC motor fan to increase airflow. The increase in airflow increases heat transfer efficiency and decreases the amount of time needed to bring a nuclear reactor to safe shutdown. The present approach further reduces costs due to reactor vessel auxiliary cooling system (RVACS) use, which may cause fuel replacement if it is the only method of decay heat removal. The heat removal enhancement reduces potential fuel damage and decreases the time needed for shutdown.

The surface area of the shroud structure 102 and/or the heat generator 110 may be calculated to provide a first order estimate of the amount of heat transfer area potentially available for the thermoelectric device 108. For instance, the inner surface area ($A_i$) of the body portion 106 of the shroud structure 102 may be calculated by $A_i=\pi D_i h$, wherein $D_i$ is the inner diameter of the body portion 106, and h is the height of the body portion 106. Assuming an inner diameter ($D_i$) of about 192 inches and a height (h) of about 778 inches, the inner surface area ($A_i$) of the body portion 106 of the shroud structure 102 will be about 3,257 ft$^2$, although example embodiments are not limited thereto. The surface area of the heat generator 110 may be similarly calculated.

A larger heat transfer area directly correlates with an increase in power production. In addition, an increase in power production (e.g., DC current) would rotate the flow control fan (e.g., of the fan arrangement) at an increasing rate, thus directly correlating a heat increase with an air flow rate increase as depicted in the following equation:

$$W=\sqrt{V_{in}^2+U_{fan}^2}$$

wherein W is the outlet air flow velocity (e.g., after the fan for a one blade system), $V_{in}$ is the inlet air flow velocity (e.g., from natural circulation), and $U_{fan}$ is the blade tip speed, which is a function of the revolutions per minute (RPM) of the fan (directly correlated to the thermoelectric DC power produced) and the fan tip radius. An increase (or decrease) in the flow velocity of the coolant is directly correlated to the heat transfer. Thus, an increase in the air flow rate as a result of an increase in an internal temperature of the shroud structure will decrease with time as the reactor decay energy decreases and the cool-down temperature is approached.

Figure 3:
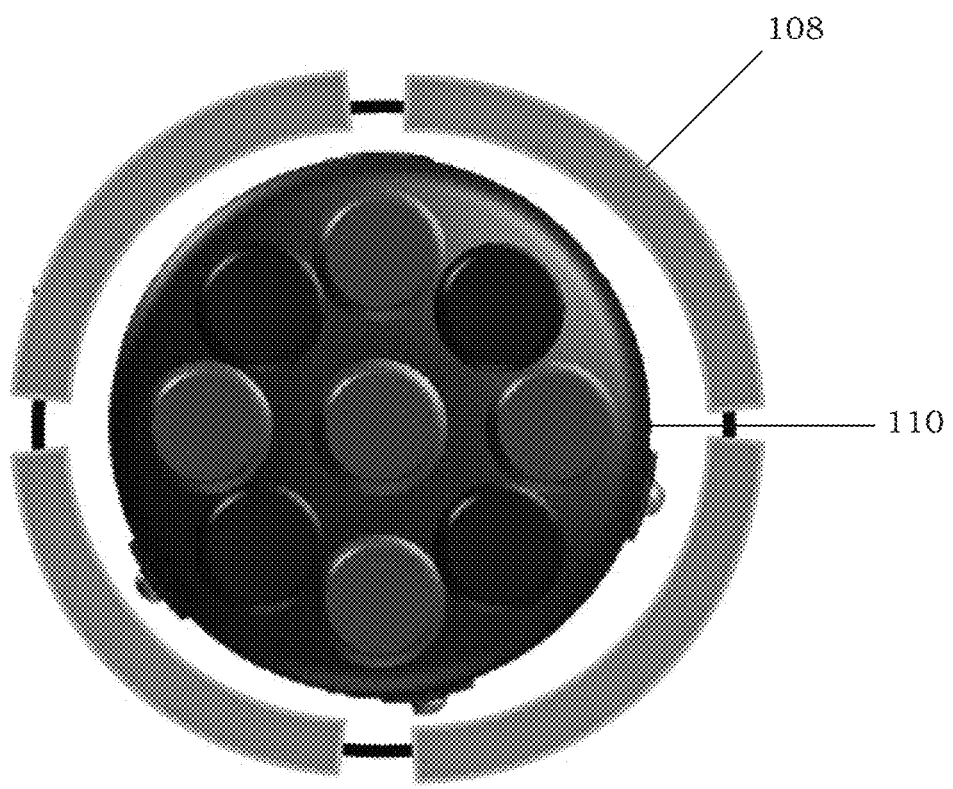
FIG. 3 is a top view of the heat generator and thermoelectric device in FIG. 2.

FIG. 3 is a top view of the heat generator and thermoelectric device in FIG. 2. Referring to FIG. 3, the thermoelectric device 108 may be in a form of a plurality of thermoelectric generators surrounding the heat generator 110. In an example embodiment, the thermoelectric device 108 may surround at least 25% of a side surface of the heat generator 110. Although four thermoelectric generators are shown in FIG. 3, it should be understood that the thermoelectric device 108 may be configured to include more (e.g., six) or less (e.g., two) thermoelectric generators. The size of each of the thermoelectric generators may be adjusted as needed to obtain the desired heat transfer area for the thermoelectric device 108. For instance, if the thermoelectric device 108 is in the form of three thermoelectric generators, then each thermoelectric generator may be configured to interface with about a third of the circumference of the heat generator 110, although example embodiments are not limited thereto.

In addition, the thermoelectric device 108 may be a sheet-like article that is conformally-shaped to follow contours of the heat generator 110. For instance, in FIG. 3, each of the plurality of thermoelectric generators of the thermoelectric device 108 may conform to the contours of the heat generator 110. In such a non-limiting embodiment, the concave side of each of the plurality of thermoelectric generators may be the hot side (heat absorption side) of the thermoelectric device 108, while the opposing convex side of each of the plurality of thermoelectric generators may be the cold side (heat rejection side) of the thermoelectric device 108.

Each of the plurality of thermoelectric generators of the thermoelectric device 108 may be electrically connected to jointly power the fan arrangement with the voltage generated from the temperature gradient caused by the heat from the heat generator 110. Alternatively, one of the plurality of thermoelectric generators of the thermoelectric device 108 may be a primary source of the voltage, and another of the plurality of thermoelectric generators may be a backup source of the voltage. In another example, the fan arrangement may be in a form of a plurality of fans, wherein each of the plurality of thermoelectric generators of the thermoelectric device 108 is electrically connected to one of the plurality of fans. For instance, in FIG. 3, there may be four independent loops of thermoelectric generators, which themselves may power four independent fans to meet safety independence requirements. This configuration provides for a redundancy in the design which keeps the system operational even if there is a failure in one or more of the fans. This system design also provides a method for tuning the response due to non-uniform heat areas in the heat generator 110, which may occur during certain operational modes or transient events or loop operation.

Figure 4:
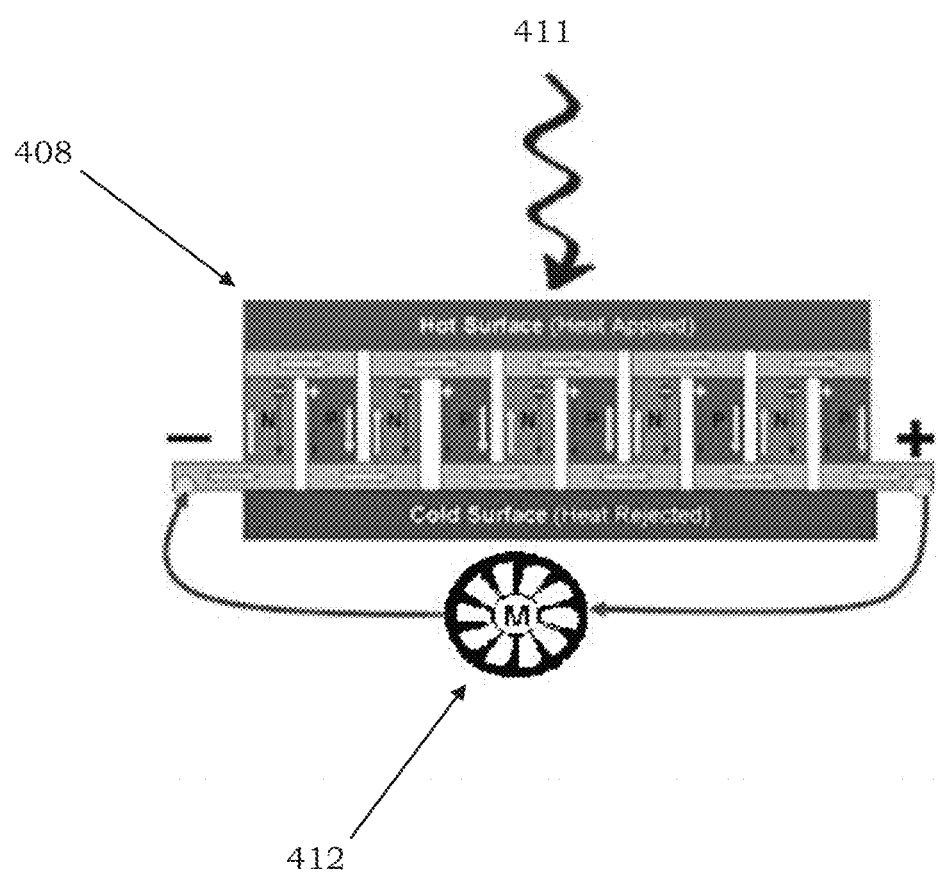
FIG. 4 is a schematic view of an operation of a thermoelectric device that is electrically connected to a fan arrangement according to an example embodiment.

FIG. 4 is a schematic view of an operation of a thermoelectric device that is electrically connected to a fan arrangement according to an example embodiment. Referring to FIG. 4, the thermoelectric device 408 is configured to power a fan arrangement 412. The fan arrangement 412 may be powered by the direct current and voltage generated as a result of the heat 411 and the consequent temperature differential between two different metals of the thermoelectric device 408. Dissimilar metals joined together may produce electrical power when heated due to the Seebeck effect shown in the following equations:

$$J=\sigma(-\nabla V+E_{emf})$$

$$E_{emf}=-S\nabla T$$

wherein J is the local current density, σ is the local conductivity, V is the local voltage, $E_{emf}$ is the electromotive field, S is the Seebeck coefficient, and T is the temperature. The Seebeck effect can be exploited to power a variety of DC devices in a nuclear reactor system. It should be understood that the principle of operation discussed in connection with FIG. 4 is also applicable to other example embodiments herein involving the thermoelectric device.

Figure 5:
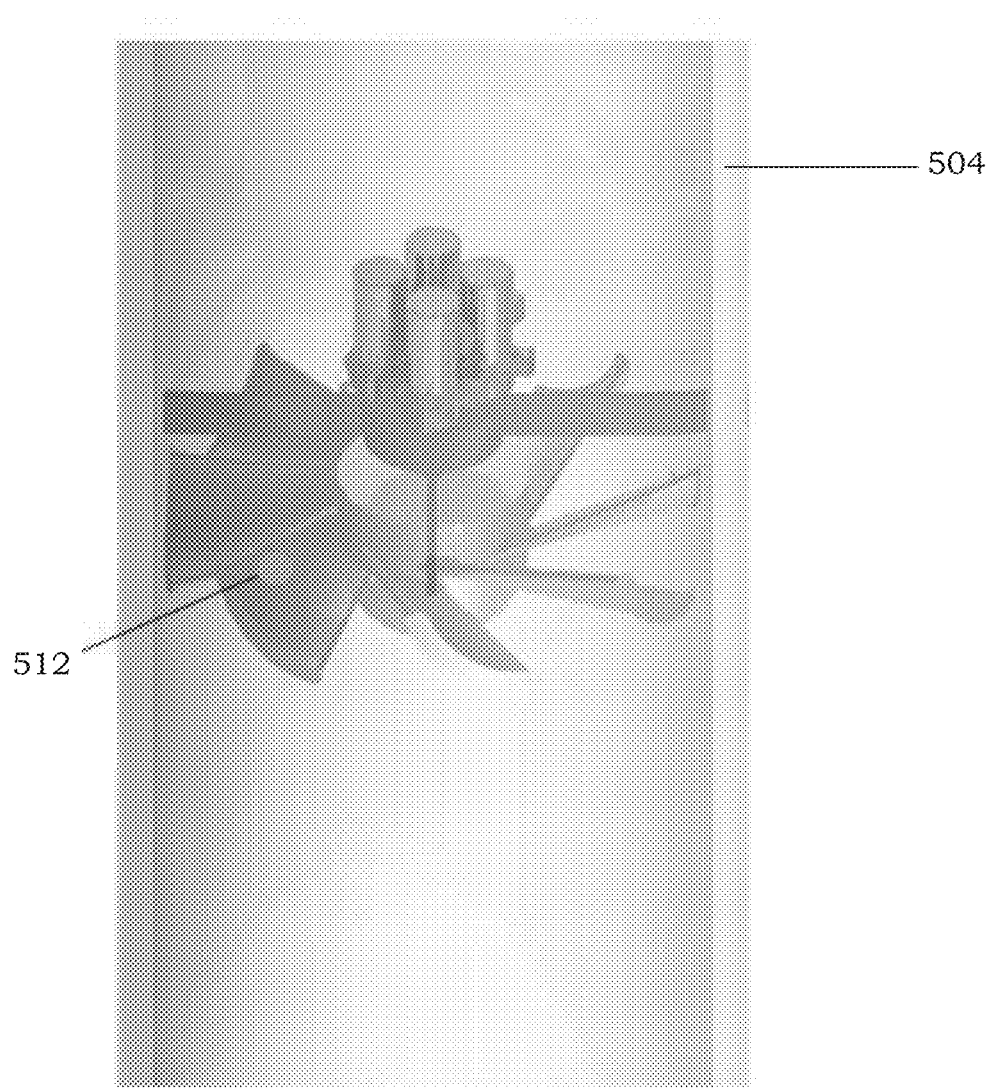
FIG. 5 is a partial, cross-sectional view of a fan arrangement that is within an upper portion of a shroud structure according to an example embodiment.

FIG. 5 is a partial, cross-sectional view of a fan arrangement that is within an upper portion of a shroud structure according to an example embodiment. Referring to FIG. 5, the fan arrangement 512 may be positioned within the upper portion 504 of a shroud structure. The fan arrangement 512 may be electrically connected to a thermoelectric device that is configured to generate a current thereto. The motor of the fan arrangement 512 is configured to increase the shaft speed (shaft RPM) as a function of increased DC current input to provide an increase in air mass flow rate in response to an increasing temperature gradient. The shaft speed of the fan arrangement will be directly proportional to the DC voltage (V) provided through some motor constant $K_{motor}$, wherein Fan RPM=$K_{motor}$*V.

A method of passively increasing a coolant flow in a natural circulation decay heat removal system may include arranging a thermoelectric device so as to be in electrical connection with a fan structure and so as to be within a coolant passage for the coolant flow. The coolant passage may be defined by an inner surface of a shroud structure and an outer surface of a heat generator. The method may additionally include supplying a voltage to the fan arrangement from the thermoelectric device based on a temperature difference caused by the heat generator in order to increase the coolant flow.

The supplying step may be based on the temperature difference between opposite parts of the thermoelectric device being at least 30 degrees Celsius. Additionally, the supplying step may be such that the voltage is at least 12 volts. The supplying step may also be such that a discharge velocity of the coolant flow is increased to at least 80 feet/second. Furthermore, the supplying step may occur during a scheduled or emergency shutdown of a nuclear power system.

The present safety system and method provides a number of technical advantages. For instance, the present approach allows for the creation of a passive system for air flow increase around a surface where heat is rejected. Additionally, air flow rate may be correlated to system temperature reduction. Heat removal may also be improved without emergency power. Moreover, the redundancy in design of the system accounts for potential individual device failures so as to meet safety requirements. Furthermore, the present approach may enhance the ACS system (PRISM) and may aid RVACS (PRISM) in overall passive safety system design structure, thus providing a full backup to RVACS. However, it should be understood that the systems and methods disclosed herein may also be applied to other reactor designs.

The present safety system and method also provides a number of commercial advantages. For instance, the present approach allows for decreased time to shutdown cool-down conditions and reduces downtime in a reactor (non-revenue generating time decreased). Additionally, there may be a sense of investment protection due to the increased safety capability. Furthermore, the RVACS peak temperature of fuel/cladding temperature limiting eutectic formation between fuel and cladding may be mitigated, thus reducing O&M cost for possible fuel replacement. It should be understood that the present systems and methods may also be applied to other reactor designs and are not limited to any of the examples discussed herein.

While a number of example embodiments have been disclosed herein, it should be understood that other variations may be possible. Such variations are not to be regarded as a departure from the spirit and scope of the present disclosure, and all such modifications as would be obvious to one skilled in the art are intended to be included within the scope of the following claims.

The invention claimed is:

1. A passive safety system for removing heat from a nuclear power system, comprising:
   a shroud structure including a body portion and an upper portion, the upper portion including an outlet opening;
   a steam generator within the body portion of the shroud structure, an inner surface of the body portion of the shroud structure and an outer surface of the steam generator defining a coolant passage therebetween, the coolant passage being in fluidic communication with the outlet opening;
   a thermoelectric device disposed in the coolant passage and in thermal contact with the steam generator, the thermoelectric device configured to generate a voltage based on a temperature difference between opposite parts of the thermoelectric device, the thermoelectric device being a sheet-like article having a heat absorption side and an opposing heat rejection side, the heat absorption side facing the outer surface of the steam generator, the heat rejection side facing the inner surface of the shroud structure; and
   a fan arrangement disposed above the steam generator and in electrical connection with the thermoelectric device, the fan arrangement configured to increase a coolant flow through the coolant passage to the outlet opening based on the voltage from the thermoelectric device.

2. The passive safety system of claim 1, wherein the nuclear power system is a liquid metal cooled reactor.

3. The passive safety system of claim 1, wherein the thermoelectric device is closer to the steam generator than the shroud structure.

4. The passive safety system of claim 1, wherein the thermoelectric device is at a distance of about 3 inches or less from the steam generator.

5. The passive safety system of claim 1, wherein the thermoelectric device has a thickness that is less than half of a spacing distance between the steam generator and the shroud structure.

6. The passive safety system of claim 1, wherein the thermoelectric device is conformally-shaped to follow contours of the steam generator.

7. The passive safety system of claim 1, wherein the thermoelectric device is closer to a top of the steam generator than a bottom of the steam generator.

8. The passive safety system of claim 1, wherein the thermoelectric device surrounds at least 25% of a side surface of the steam generator.

9. The passive safety system of claim 1, wherein the thermoelectric device includes a concave side and an opposing convex side, the concave side being the heat absorption side, the convex side being the heat rejection side.

10. The passive safety system of claim 1, wherein the thermoelectric device is disposed circumferentially around the steam generator.

11. The passive safety system of claim 1, wherein the thermoelectric device is in a form of a plurality of thermoelectric generators surrounding the steam generator.

12. The passive safety system of claim 11, wherein each of the plurality of thermoelectric generators is electrically connected to jointly power the fan arrangement with the voltage.

13. The passive safety system of claim 11, wherein one of the plurality of thermoelectric generators is a primary source of the voltage, and another of the plurality of thermoelectric generators is a backup source of the voltage.

14. The passive safety system of claim 11, wherein the fan arrangement is in a form of a plurality of fans, each of the plurality of thermoelectric generators being electrically connected to one of the plurality of fans.

15. The passive safety system of claim 1, wherein the fan arrangement is disposed in the upper portion of the shroud structure below the outlet opening.

16. A method of passively increasing a coolant flow in a natural circulation decay heat removal system, comprising:
   arranging a thermoelectric device so as to be in electrical connection with a fan arrangement and so as to be within a coolant passage for the coolant flow, the coolant passage defined by an inner surface of a shroud structure and an outer surface of a steam generator, the shroud structure including a body portion and an upper portion, the upper portion including an outlet opening, the steam generator within the body portion of the shroud structure, an inner surface of the body portion of the shroud structure and the outer surface of the steam generator defining the coolant passage therebetween, the coolant passage being in fluidic communication with the outlet opening, the thermoelectric device in thermal contact with the steam generator, the thermoelectric device configured to generate a voltage based on a temperature difference between opposite parts of the thermoelectric device, the thermoelectric device being a sheet-like article having a heat absorption side and an opposing heat rejection side, the heat absorption side facing the outer surface of the steam generator, the heat rejection side facing the inner surface of the shroud structure, the fan arrangement disposed above the steam generator and configured to increase the coolant flow through the coolant passage to the outlet opening based on the voltage from the thermoelectric device; and
   supplying the voltage to the fan arrangement from the thermoelectric device based on the temperature difference caused by the steam generator in order to increase the coolant flow.

17. The method of claim 16, wherein the supplying is based on the temperature difference between opposite parts of the thermoelectric device being at least 30 degrees Celsius.

18. The method of claim 16, wherein the supplying is such that the voltage is at least 12 volts.

19. The method of claim 16, wherein the supplying is such that a discharge velocity of the coolant flow is increased to at least 80 feet/second.

20. The method of claim 16, wherein the supplying occurs during a scheduled or emergency shutdown of a nuclear power system.

* * * * *